United States Patent
Matsuda et al.

(10) Patent No.: US 6,795,353 B2
(45) Date of Patent: Sep. 21, 2004

(54) GENERATING HIGH VOLTAGES IN NONVOLATILE MEMORY DEVICES AND DATA PROCESSING SYSTEMS

(75) Inventors: Yuki Matsuda, Kodaira (JP); Norihisa Yamamoto, Kodaira (JP); Kazuhiro Matsushita, Kodaira (JP); Kazuki Watanabe, Kokubunji (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/187,299

(22) Filed: Jul. 2, 2002

(65) Prior Publication Data

US 2003/0021153 A1 Jan. 30, 2003

(30) Foreign Application Priority Data

Jul. 27, 2001 (JP) ...................................... 2001-227351

(51) Int. Cl.[7] ................................................ G11C 7/00
(52) U.S. Cl. ............. 365/191; 365/189.09; 365/189.06; 365/189.04; 365/233
(58) Field of Search ........................... 365/191, 189.09, 365/189.06, 189.04, 185.18, 233

(56) References Cited

U.S. PATENT DOCUMENTS

2002/0001207 A1 * 1/2002 Kishimoto et al. ........... 363/59

OTHER PUBLICATIONS

Sawada et al., "An On–Chip High–Voltage Generator Circuit for EEPROMs with a Power Supply Voltage below 2V," 1995 Symposium on VLSI Circuit Digest of Technical Papers, 1995.

* cited by examiner

Primary Examiner—David Nelms
Assistant Examiner—Long Tran
(74) Attorney, Agent, or Firm—Miles & Stockbridge P.C.

(57) ABSTRACT

A nonvolatile memory device and a data processing system with a reduced layout area are capable of efficiently generating a high voltage without deteriorating the charge transfer efficiency of a charge pump circuit. The charge pump circuit in a nonvolatile memory device includes a plurality of stages of charge pump unit circuits. A voltage generating unit provides, as a control signal to the gate of a first MOS transistor for transferring charges from a first capacitor of a charge pump unit circuit of one stage to a first capacitor at the next stage, a fourth signal having an amplitude of a difference voltage between the power supply voltage and the charge pump voltage of the first capacitor at the one stage. The fourth control signal is obtained from second and third signals each changing in amplitude of the power supply voltage. The second signal is supplied via a second capacitor.

13 Claims, 16 Drawing Sheets

GENERATING HIGH VOLTAGES IN NONVOLATILE MEMORY DEVICES AND DATA PROCESSING SYSTEMS

BACKGROUND OF THE INVENTION

The present invention relates to a nonvolatile memory device and a data processing system and, particularly, to a technique effective to be applied to generation of a high voltage in a flash memory, EEPROM (Electrically Erasable Programmable Read Only Memory) and the like.

The inventor herein has examined and found that, for example, a flash memory, EEPROM, or the like is provided with a high-voltage generating circuit for generating an increased high voltage used for writing data.

FIG. 4 shows, as an example, the configuration of a high-voltage generating circuit 40 as a voltage generating unit and its peripheral circuits provided for an EEPROM.

In the peripheral portion of the high-voltage generating circuit 40, a write clock generating circuit 41, a timing control circuit 42, a boost control signal generating circuit 43, a voltage clamping circuit 44, and a memory control circuit 45 are provided.

The write clock generating circuit 41 receives a write command output from a CPU or the like, generates a write clock signal, and outputs the write clock signal to the timing control circuit 42. The timing control circuit 42 controls timings of clock signals and outputs the clock signals to the boost control signal generating circuit 43, memory control circuit 45, and a memory mat 46.

The boost control signal generating circuit 43 generates a control signal for boost from the clock signal output from the write clock generating circuit 41 and outputs it to the high-voltage generating circuit 40. The high-voltage generating circuit 40 increases a power supply voltage, thereby generating an increased power supply voltage. The voltage clamping circuit 44 clamps the increased power supply voltage generated by the high-voltage generating circuit 40 to a certain level and outputs the resultant voltage to the memory mat 46 via the memory control circuit 45.

The high-voltage generating circuit 40 takes the form of, for example as shown in FIG. 5, a charge pump circuit in which a plurality (for example, 24) of depletion-type MOS (Metal Oxide Semiconductor) transistors are connected in series.

In the high-voltage generating circuit 40 taking the form of a charge pump circuit, a capacitance connected to the gate of a transistor is similarly constructed by a depletion-type MOS transistor.

By using the control signal generated by the boost control signal generating circuit 43, the high-voltage generating circuit 40 generates an increased power supply voltage by a charge pumping operation.

A technique of generating an increased power supply voltage in an EEPROM or the like is described by, for example, Masui, Sawada, and Sugawara in literature "An On-Chip High-Voltage Generator Circuit for EEPROMs with a Power Supply Voltage below 2V", 1995 Symposium on VLSI Circuit Digest of Technical Papers, 1995. The literature describes a high-voltage generator circuit for efficiently generating an increased power supply voltage by providing a bootstrap circuit for amplifying the amplitude of a clock signal.

SUMMARY OF THE INVENTION

The inventor herein has, however, found that the technique of generating an increased power supply voltage by the high-voltage generator circuit as described above has the following problem.

Specifically, to assure charge transfer capability, a number of dedicated depletion MOS transistors having a low threshold voltage are necessary. Consequently, problems arise such that the layout area of a semiconductor chip becomes large and the manufacturing efficiency of a semiconductor integrated circuit device deteriorates.

An object of the invention is to provide a nonvolatile memory device and a data processing system capable of efficiently generating a high voltage, with a reduced layout area of a semiconductor chip without deteriorating the charge transfer efficiency due to dependency on backward bias when a high voltage is generated.

The above and other objects and novel features of the invention will become apparent from the description of the specification and the attached drawings.

Representative aspects of the invention disclosed in the application will be briefly described as follows.

The present invention provides a technique of generating a high voltage in, for example, a semiconductor processing device in which a nonvolatile semiconductor memory as shown in FIG. 2 is mounted. The nonvolatile memory device includes a nonvolatile memory 12 having nonvolatile memory cells, a central processing unit (hereinbelow, CPU) 9, and a high-voltage generating circuit 15 for supplying a predetermined voltage to be supplied to the nonvolatile memory cells. The high-voltage generating circuit generates a predetermined voltage to be applied to a memory cell in each of the operations in accordance with a control from the CPU, and has a control signal generating circuit and a plurality of charge pump unit circuits. The control signal generating circuit generates a control signal to be supplied to the plurality of charge pump unit circuits. The charge pump unit circuit has, for example in FIG. 6, an input terminal 101, an output terminal 105, first, second, and third signal input terminals 102, 103, and 104 for receiving first, second, and third signals, respectively, each signal having an amplitude of a power supply voltage, a power supply terminal 107, and a bias terminal 106 for a well of a predetermined MOS transistor. The second and third signals are signals changing synchronously with the first signal as shown in FIGS. 7 and 8 and changing in predetermined time in a cycle of the first signal. The voltage generating unit is a circuit in which the plurality of the charge pump unit circuits 2001, 2002, 2003, and 2004 are cascaded as shown in FIG. 9, for generating a predetermined voltage. The first signals supplied to an odd-numbered stage and an even-numbered stage of the plurality of cascaded unit circuits have opposite phases as shown in FIG. 10 and each of the second and third signals is generated from the first signal. The charge pump unit circuit has: a function of transmitting a signal to an input terminal 101 via a first capacitor 121 in accordance with a change in the first signal having a change in the amplitude of the power supply voltage supplied; a first MOS transistor 131 for charge transfer whose drain is connected to the input terminal 101 and whose source is connected to an output terminal 105; a circuit 501 for generating and outputting a composite signal of the second and third signals as a fourth signal having a change in voltage between the power supply voltage terminal 107 and the input terminal 101 to a fourth signal output terminal 108; a circuit for transmitting the fourth signal to the gate terminal 109 of the first MOS transistor 131 via a third capacitor 123; a second bias circuit 142 connected between the gate terminal 109 of the first MOS transistor 131 and the input terminal 101; and a fourth MOS transistor 134 whose gate terminal is connected to the output terminal 105. A source electrode and a drain electrode of the fourth MOS transistor 134 are connected to the gate terminal 109 of the first MOS transistor 131 and the input terminal 101, respectively. The fourth signal generating circuit 501 includes a second MOS transistor 132, a third MOS transistor 133, a second capacitor 122, and a first bias circuit 141. The second signal is supplied to the gate terminal 110 of the second MOS transistor 132 via the second capacitor 122, the source and drain of the second MOS transistor 132 are connected to the input terminal 101 and the fourth signal output terminal 108, respectively. The gate of the second MOS transistor 132 is biased to the input terminal 101 by the first bias circuit 141. The gate, source, and drain of the third MOS transistor 133 are connected to the third signal terminal 104, the power supply terminal 107, and the fourth signal output terminal 108, respectively. The well of each of the first and fourth MOS transistors 131 and 134 is connected to the well bias terminal 106, to which a predetermined well bias voltage is supplied.

A concrete circuit of each of the bias circuits 141 and 142 is realized by a resistor shown in FIG. 13, a MOS diode circuit shown in FIG. 14, or a bidirectional MOS diode circuit shown in FIG. 15.

The outline of some additional aspects of the present invention will be briefly described.

1. A Data Processing System

The system includes a nonvolatile memory unit, a volatile memory unit, a central processing unit, and a semiconductor processing device to which an operation instruction signal and an operation voltage are supplied. The nonvolatile memory unit has a plurality of nonvolatile memory cells for storing information and a voltage increasing unit comprised of a plurality of charge pump unit circuits. The voltage increasing unit receives a power supply voltage supplied and generates a first predetermined voltage to be supplied to a nonvolatile memory cell so as to store information to the nonvolatile memory cell. The voltage increasing unit has a control signal generating circuit for generating a clock signal to be supplied to the plurality of charge pump circuits and the plurality of charge pump circuits. The nonvolatile memory unit selects a nonvolatile memory to which desired information is stored, supplies the first predetermined voltage to the selected memory, and stores the desired information to the selected memory.

2. Nonvolatile Memory Device

The nonvolatile memory device has a memory array having a plurality of nonvolatile memory cells, a control unit, and a voltage generating unit for supplying a predetermined voltage to a nonvolatile memory cell. The memory array can store desired information and has a plurality of word lines and a plurality of data lines. The gate electrode of each nonvolatile memory cell is connected to a corresponding word line, and the nonvolatile memory cells are connected to corresponding data lines, thereby forming nonvolatile memory cells in an array. The memory array has one or more groups of nonvolatile memory cells sharing a well region. The control unit controls supply of a voltage generated by the voltage generating unit to a corresponding word line and/or a corresponding well region to erase the information stored in a nonvolatile memory cell. The voltage generating unit has a control signal generating circuit for generating a clock signal to be supplied to the plurality of charge pump unit circuits, and the plurality of charge pump unit circuits.

3. Data Processing System

The system has one or more nonvolatile memory devices and a central processing unit. The nonvolatile memory device has a plurality of nonvolatile memory cells and a voltage generating unit. The nonvolatile memory device instructs the voltage generating unit to generate a predetermined voltage in accordance with an operation instruction from the central processing unit to store, read, or erase information to/from a nonvolatile memory cell. The voltage generating unit has a control signal generating circuit for generating a clock signal to be supplied to the plurality of charge pump unit circuits and the plurality of charge pump circuits. To each of the charge pump unit circuits, a power supply voltage is applied. The charge pump unit circuit at the final stage outputs a predetermined voltage.

DETAILED DESCRIPTION OF THE PREFERRED EMBODIMENTS

Embodiments of the invention will be described in detail hereinbelow with reference to the drawings.

First Embodiment

Figure 1:
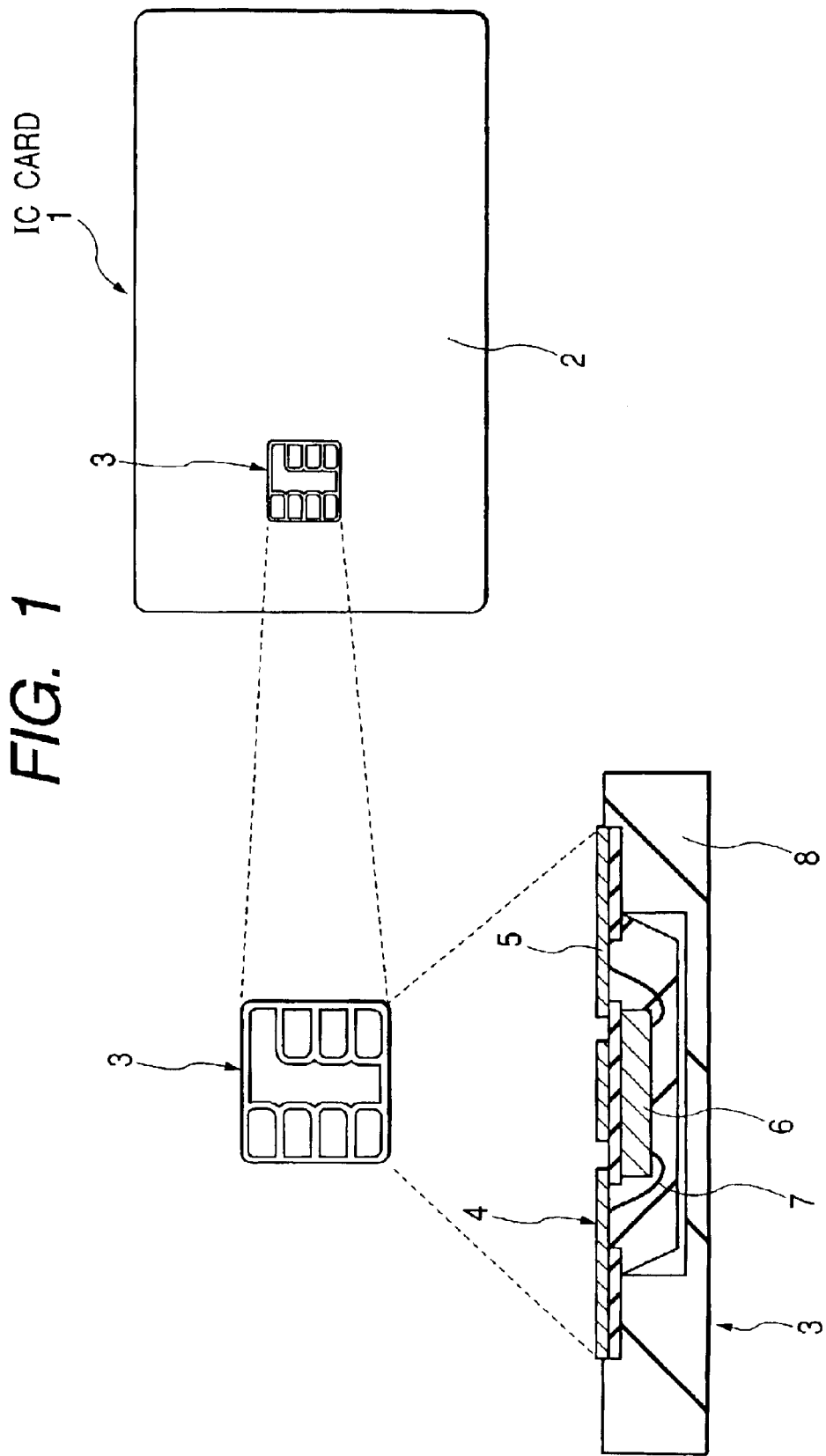
FIG. 1 is an explanatory diagram of an IC card in a first embodiment of the invention.
Figure 2:
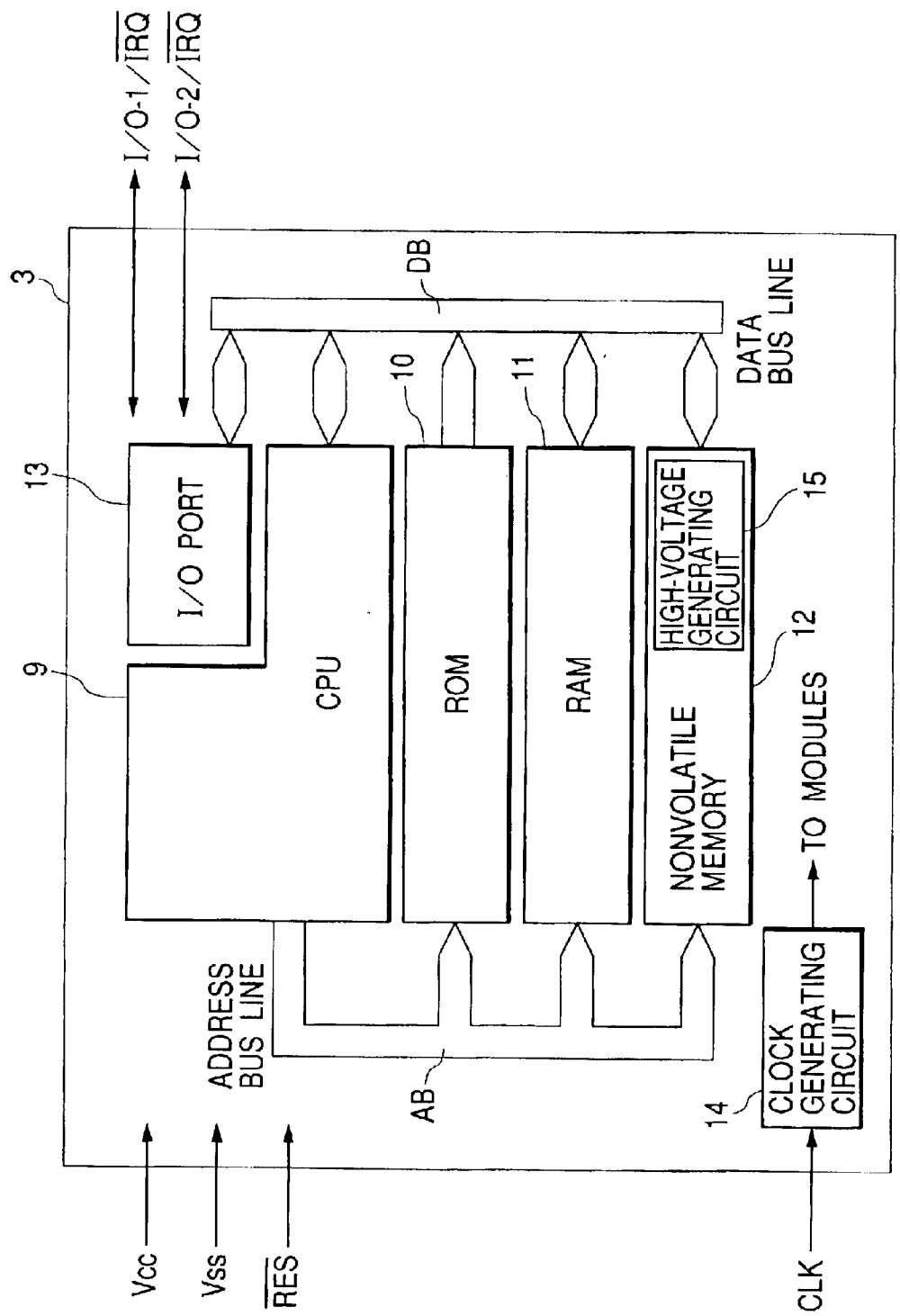
FIG. 2 is a block diagram of a semiconductor integrated circuit device provided for the IC card in FIG. 1.
Figure 6:
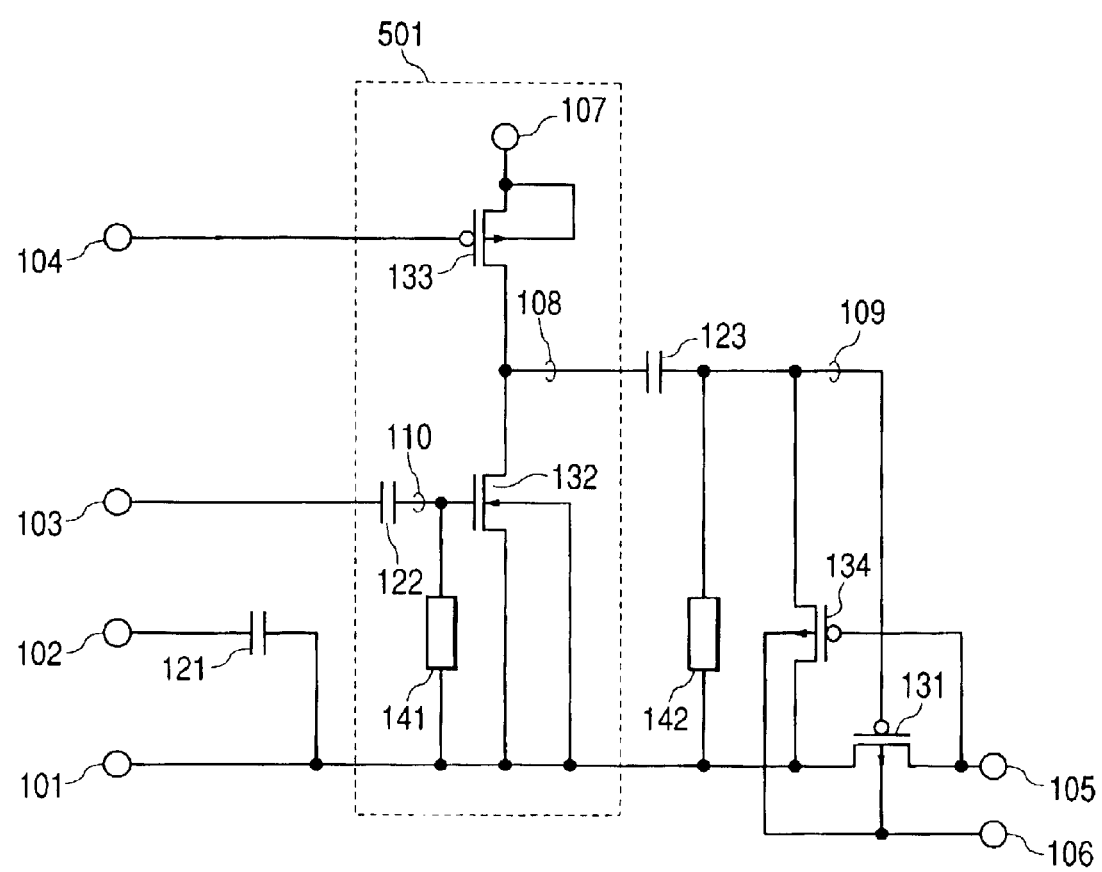
FIG. 6 is a circuit diagram of a charge pump unit provided for the high-voltage generating circuit in FIG. 4.
Figure 7:
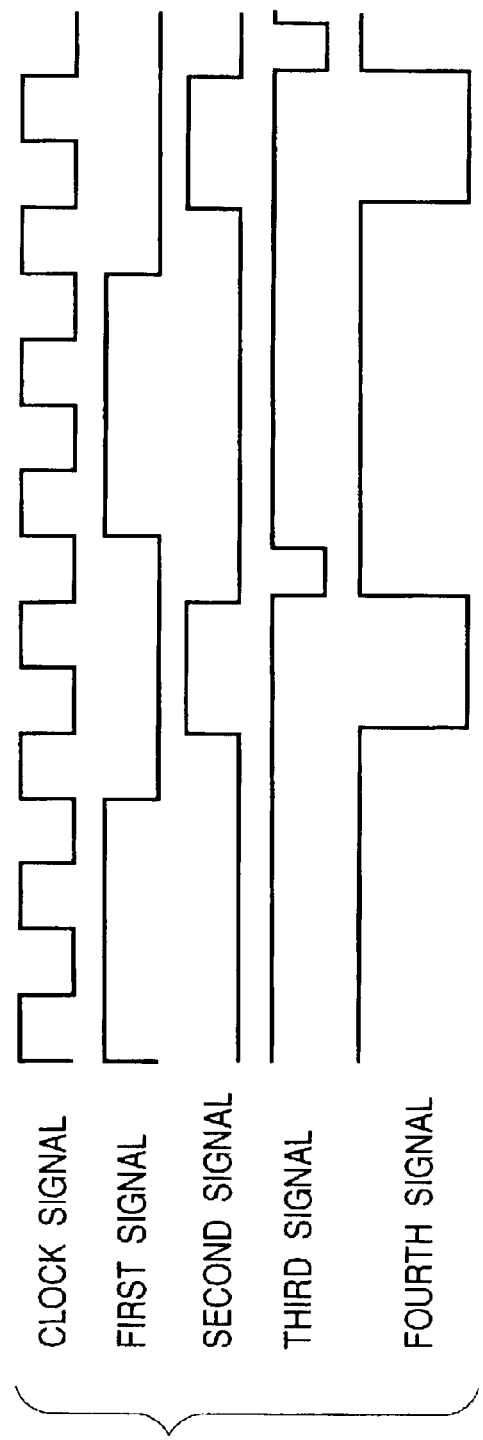
FIG. 7 is a timing chart showing an example of various control signals generated by a boost clock generating unit in FIG. 4.
Figure 8:
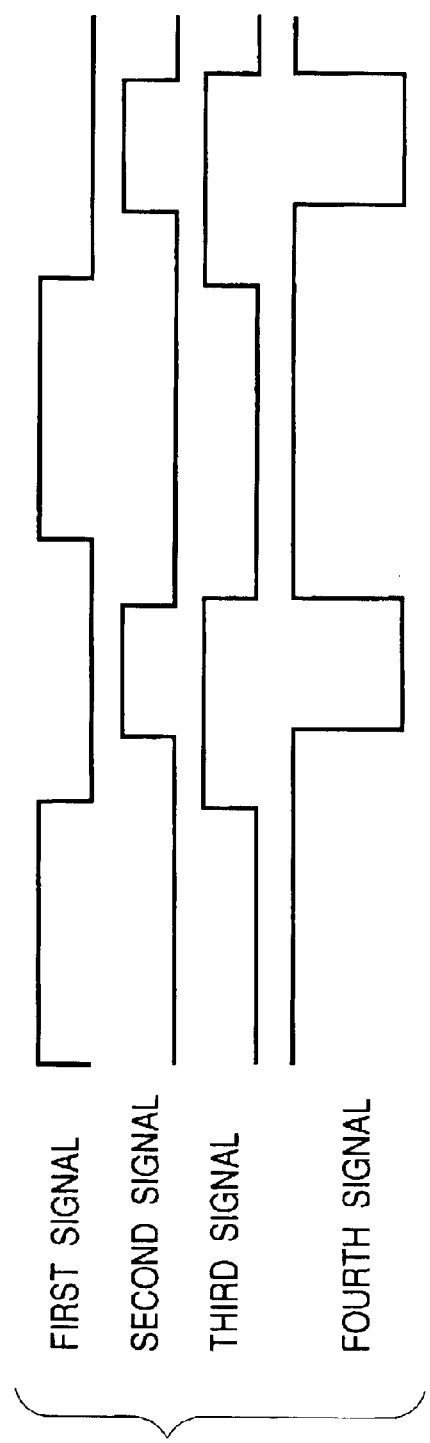
FIG. 8 is a timing chart showing an example of various control signals generated by the boost clock generating unit in FIG. 4.
Figure 9:
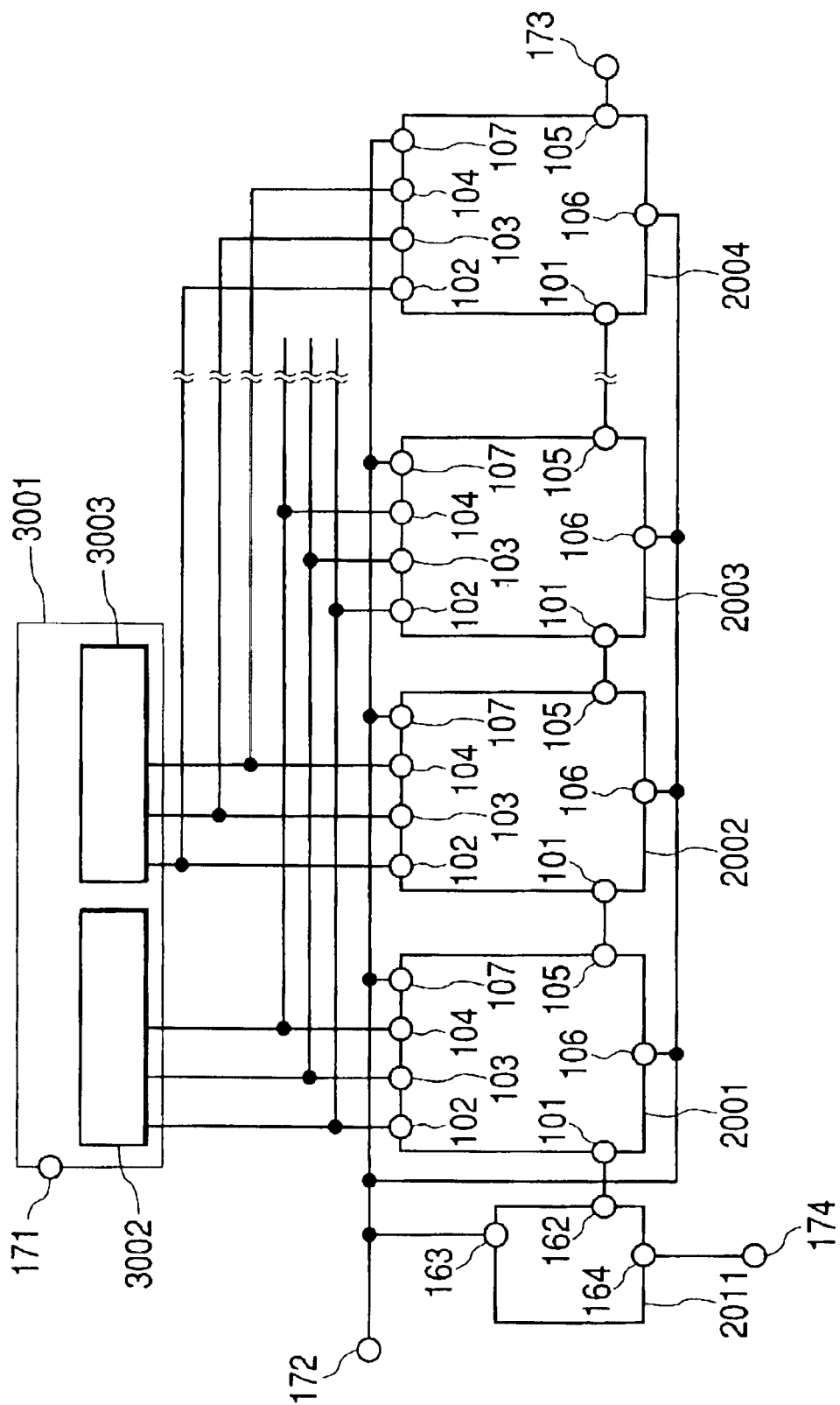
FIG. 9 is a block diagram of a high-voltage generating circuit provided for the semiconductor integrated circuit device in FIG. 2.

FIG. 1 is an explanatory diagram of an IC card according to a first embodiment of the invention, FIG. 2 is a block diagram of a semiconductor integrated circuit device provided for the IC card of FIG. 1, FIG. 9 is a block diagram of a high-voltage generating circuit provided for the semiconductor integrated circuit device of FIG. 2, FIGS. 7, 8, and 10 show examples of a timing chart of various clock signals generated by a boost control signal generating unit in FIG. 9, and FIG. 6 is a circuit diagram of a charge pump unit as a basic cell in a high-voltage generating unit provided for the high-voltage generating circuit in FIG. 9.

In the first embodiment, an IC card (data processing system) 1 has the shape and size of a card, stores information, and executes calculation. In the IC card 1, as shown in FIG. 1, a semiconductor integrated circuit device 3 such as a nonvolatile embedded processor is buried in a plastic card 2 having the shape of a credit card.

The semiconductor integrated circuit device 3 is provided with a tape film 5 made of glass epoxy resin or the like and a plurality of terminal electrodes 4 are formed on one of faces of the tape film 5.

To/from the semiconductor integrated circuit device 3, various data, an interruption signal, a power supply voltage, a reset signal, a clock signal, and the like are input/output via the terminal electrodes 4. On a chip mounting face (the other face) of the tape film 5, a semiconductor chip 6 is mounted via an adhesive or the like.

Bonding pads are provided around the semiconductor chip 6 and connected to the back face of the terminal electrodes 4 via bonding wires 7.

The semiconductor chip 6, bonding wires 7, and their periphery are sealed with a mold resin or the like, thereby forming a sealed portion 8.

The semiconductor integrated circuit device 3 provided for the IC card 1 includes, as shown in FIG. 2, a CPU (Central Processing Unit) 9, a ROM 10, a RAM (nonvolatile storing unit) 11, a nonvolatile memory (nonvolatile storing unit) 12, an I/O port 13, a clock generating circuit 14, and the like which are formed on a single semiconductor substrate.

Layout of a processor chip for use in the IC card 1 is not limited to that shown in FIG. 1 and is not also limited to an outer shape such as a contact type in which a terminal is exposed to the outside of the IC card as shown in FIG. 1, a non-contact type in which a terminal is not exposed to the outside of the IC card, or a contact/non-contact type including a terminal exposed and a terminal which is not exposed.

The semiconductor integrated circuit device 3 is not limited to one having the ROM 10 and RAM 11 shown in FIG. 2 but includes one having either a ROM or RAM and one which does not have both of ROM and RAM. It is sufficient for the semiconductor integrated circuit device 3 to have at least a logical circuit part typified by a CPU and a nonvolatile memory to which data can be electrically written at least once.

The CPU 9 reads a program, data, and the like stored in the nonvolatile memory 12 in response to a predetermined signal from the outside or the like and executes a predetermined process. Data which is generated by a process executed by the CPU 9 and has to be stored also after the power source supplied to the semiconductor integrated circuit device 3 is temporarily stopped is written into the nonvolatile memory 12.

The CPU 9 gives an instruction of data writing operation to the nonvolatile memory 12, and a high-voltage generating circuit 15 in the nonvolatile memory 12 generates a high voltage necessary for writing data to a memory cell in response to the write operation instruction and writes data. As such data, personal information (user name, personal identification number, and the like) in the IC card 1 can be mentioned.

Some data has to be newly written after erasing data already written. In this case, the CPU 9 generates a high voltage necessary to erase data written in the nonvolatile memory 12 and erases the written data. After that, a high voltage necessary to write new data is generated to write new data. The data is, for example, financial information (deposit balance and the like) in the IC card 1.

The CPU 9 is a processor which governs controls of reading, writing, and the like of information in the IC card 1. To the CPU 9, the ROM 10, RAM 11, nonvolatile memory 12, I/O port 13, clock generating circuit 14, and the like are connected via an address bus line AB and a data bus line DB.

In the ROM 10, a control program for operating the CPU 9, and the like are stored. The ROM 10 is a read only memory or the like. The RAM 11 is a memory from/to which data can be always read/written, and temporarily stores input/output data, arithmetic data, and so on.

The nonvolatile memory 12 selects a nonvolatile memory cell to/from which data is written/erased in response to a write operation instruction or an erase operation instruction from the CPU 9, applies a high voltage generated by the high-voltage generating circuit 15 to a gate electrode or a well electrode of the selected nonvolatile memory cell, and stores charges in a charge storing layer.

The I/O port 13 is a port from/to which data is output/input in the IC card 1, and the clock generating circuit 14 generates a clock signal from an external clock signal and supplies the clock signal to modules.

The high-voltage generating circuit 15 provided for the nonvolatile memory 12 generates an increased high voltage to be used for writing or erasing data as described above.

The high-voltage generating circuit 15 includes, as shown in FIG. 9, a boost control signal generating circuit 3001 and charge pump unit circuits 2001 to 2004 as a high-voltage generating portion. The boost control signal generating circuit 3001 generates six kinds of control signals for boost shown in FIG. 10 used when the charge pump unit circuits 2001 to 2004 generate an increased high voltage.

The boost control signal generating circuit 3001 includes a control signal generating circuit 3002 for controlling odd-numbered stages and a control signal generating circuit 3003 for controlling even-numbered stages.

In FIG. 6, a concrete circuit of each of the charge pump unit circuits 2001 to 2004 includes an input terminal 101, an output terminal 105, input terminals 102, 103, and 104 of first to third signals each having an amplitude of a power supply voltage, respectively, a power supply terminal 107, and a bias terminal 106 of a well in a predetermined MOS transistor.

The second and third signals are signals which change synchronously with the first signal as shown in FIGS. 7 and 8 and change in predetermined time of a cycle of the first signal. The charge pump unit circuit includes: a function of transmitting a signal to the input terminal 101 via a first capacitor 121 in accordance with a change in the first signal having an amplitude change of a power supply voltage supplied; a first MOS transistor 131 for charge transfer whose drain is connected to the input terminal 101 and whose source is connected to the output terminal 105; a circuit 501 for generating and outputting a composite signal of the second and third signals to the power supply terminal 107 and generating and outputting a fourth signal which changes in voltage between the power supply terminal 107 and the input terminal 101 to a fourth signal output terminal 108; a circuit for transmitting the fourth signal to a gate terminal 109 of the first MOS transistor 131 via a third capacitor 123; a second bias circuit 142 connected between the gate terminal 109 of the first MOS transistor 131 and the input terminal 101; and a fourth MOS transistor 134 whose gate terminal is connected to the output terminal 105. The source electrode and the drain electrode of the fourth MOS transistor 134 are connected to the gate terminal 109 of the first MOS transistor 131 and the input terminal 101. The fourth signal generating circuit 501 includes a second MOS transistor 132, a third MOS transistor 133, a second capacitor 122, and a first bias circuit 141. The second signal is supplied via the second capacitor 122 to a gate terminal 110 of the second MOS transistor 132. The source and drain of the second MOS transistor 132 are connected to the input terminal 101 and the fourth signal output terminal 108, respectively. The gate of the second MOS transistor 132 is biased to the input terminal 101 by the first bias circuit 141. The gate, source, and drain of the third MOS transistor 133 are connected to the third signal terminal 104, the power supply terminal 107, and the fourth signal output terminal 108, respectively. The well of the first MOS transistor 131 and the well of the fourth MOS transistor 134 are connected to the well bias terminal 106 and operate on a predetermined well bias voltage supplied.

Figure 13:
FIG. 13 shows a bias circuit as an example of first and second bias circuits in the charge pump unit in FIG. 6.
Figure 14:
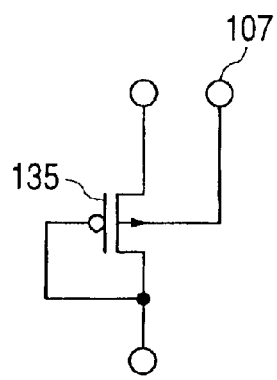
FIG. 14 shows a bias circuit as an example of first and second bias circuits in the charge pump unit in FIG. 6.
Figure 15:
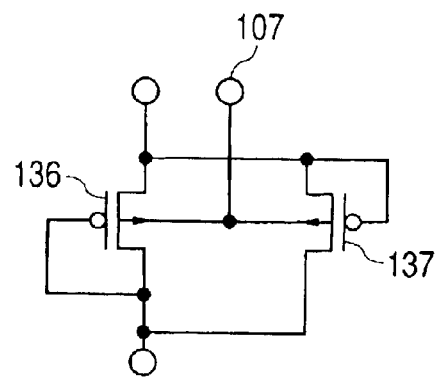
FIG. 15 shows a bias circuit as an example of first and second bias circuits in the charge pump unit in FIG. 6.

A concrete circuit of the bias circuits 141 and 142 is realized by a resistor shown in FIG. 13, an MOS diode circuit shown in FIG. 14, or a bidirectional MOS diode circuit shown in FIG. 15.

Figure 19:
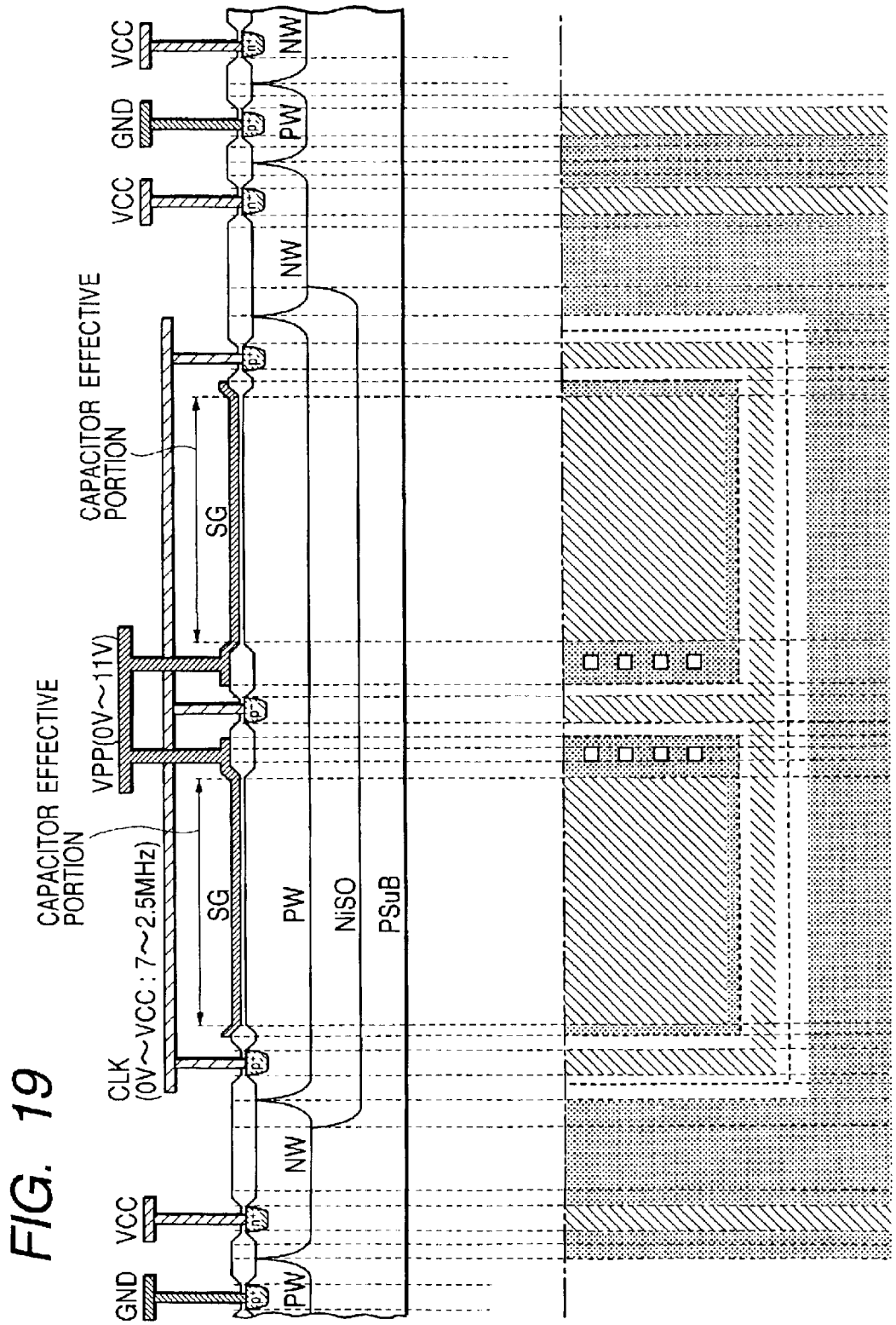
FIG. 19 shows an example of a capacitive element in the charge pump unit in FIGS. 9 and 18.

As a capacitor used for the charge pump unit circuits 2001 to 2004, as shown in FIG. 19, a so-called oxide film capacitor formed via an insulating film between a conducive material same as that of the second gate electrode and a conductive material same as that of the p-well is used.

Figure 11:
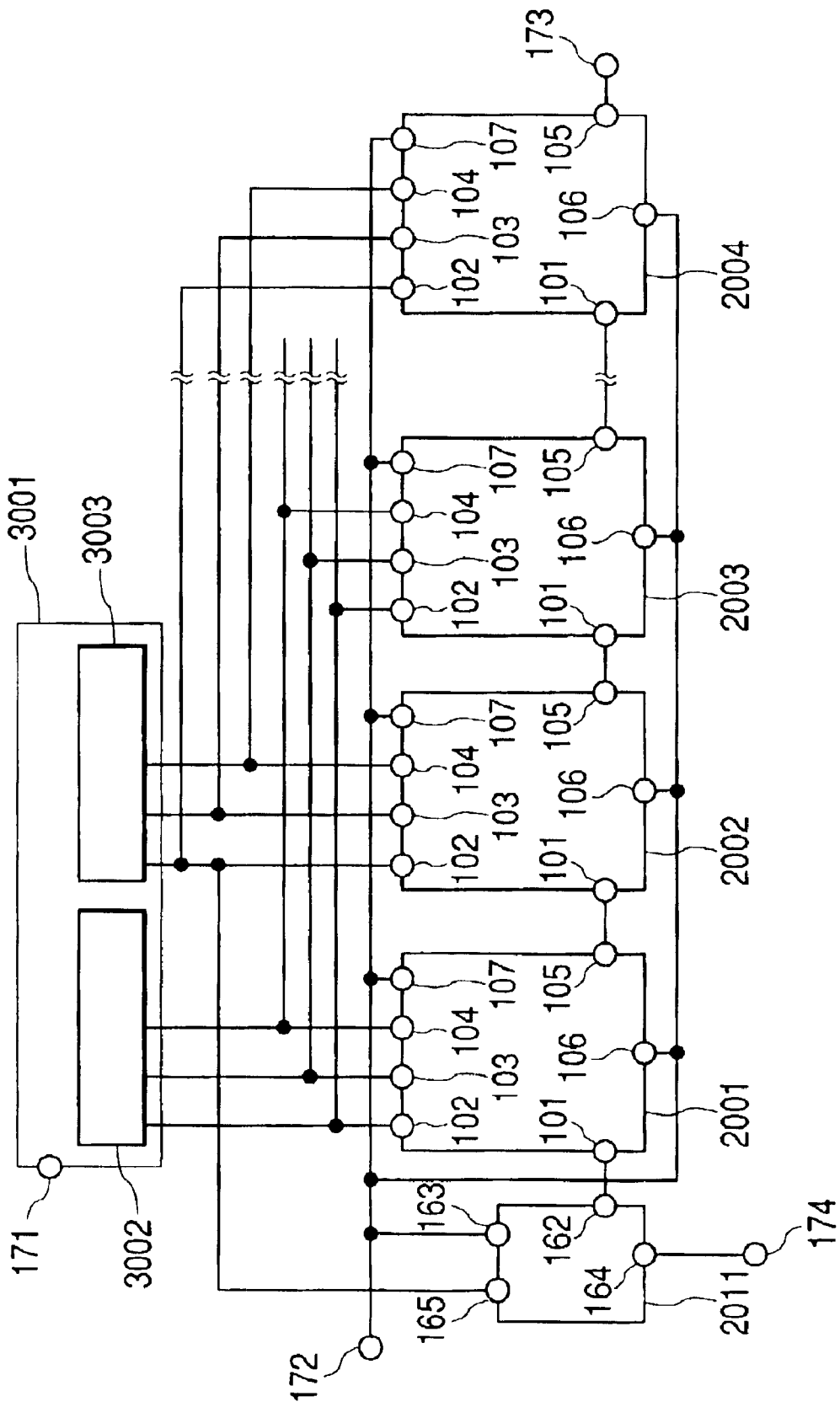
FIG. 11 is a block diagram showing an example where a clamp circuit of the charge pump unit at the first stage exists separately in the high-voltage generating circuit in FIG. 9.
Figure 12:
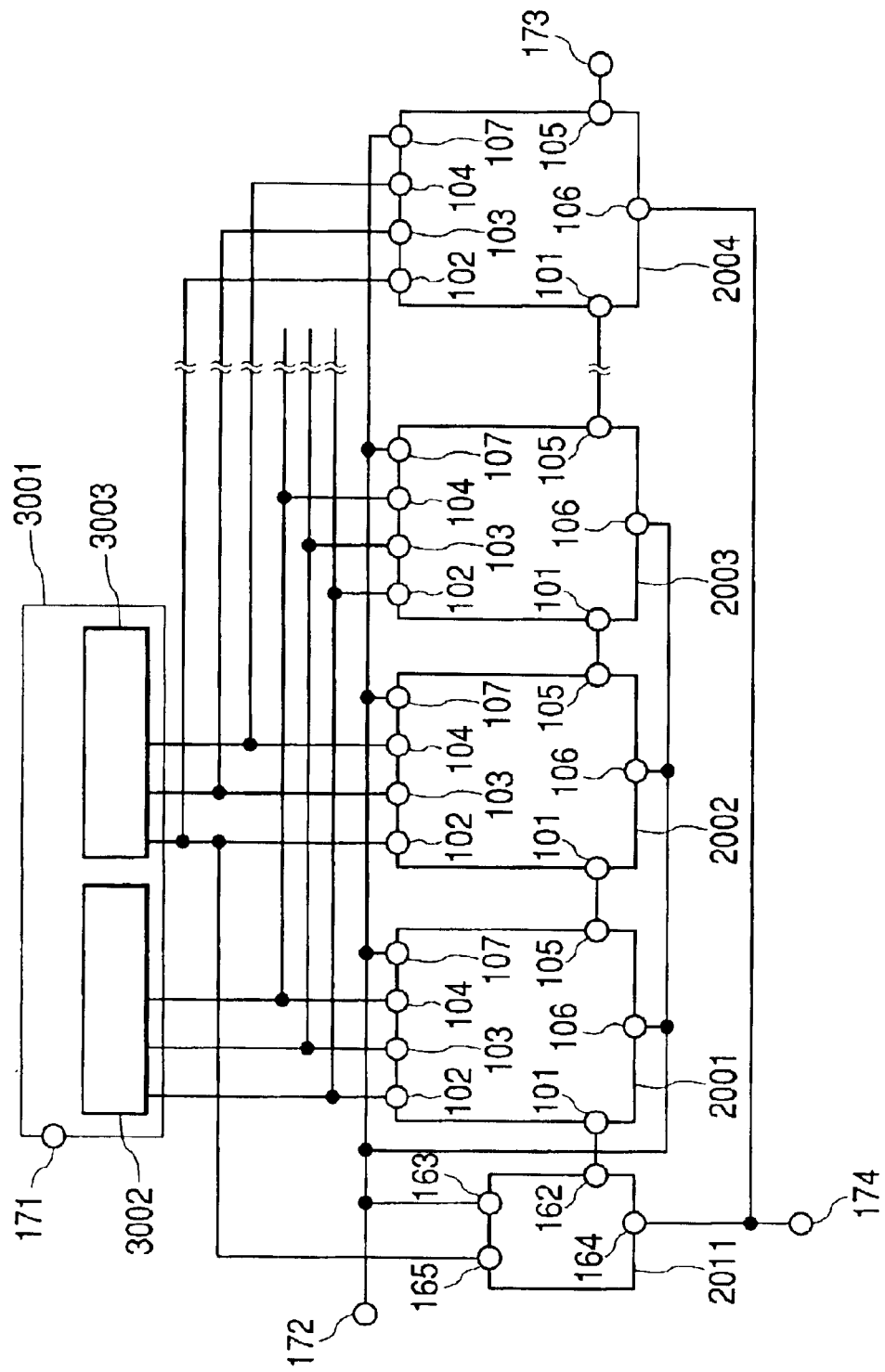
FIG. 12 is a block diagram showing an example in which a bias to a well is changed in the high-voltage generating circuit in FIG. 9.

The charge pump unit circuits are used by being cascaded like 2001, 2002, 2003, and 2004 in the charge pump circuit shown in each of FIGS. 9, 11, and 12.

Figure 10:
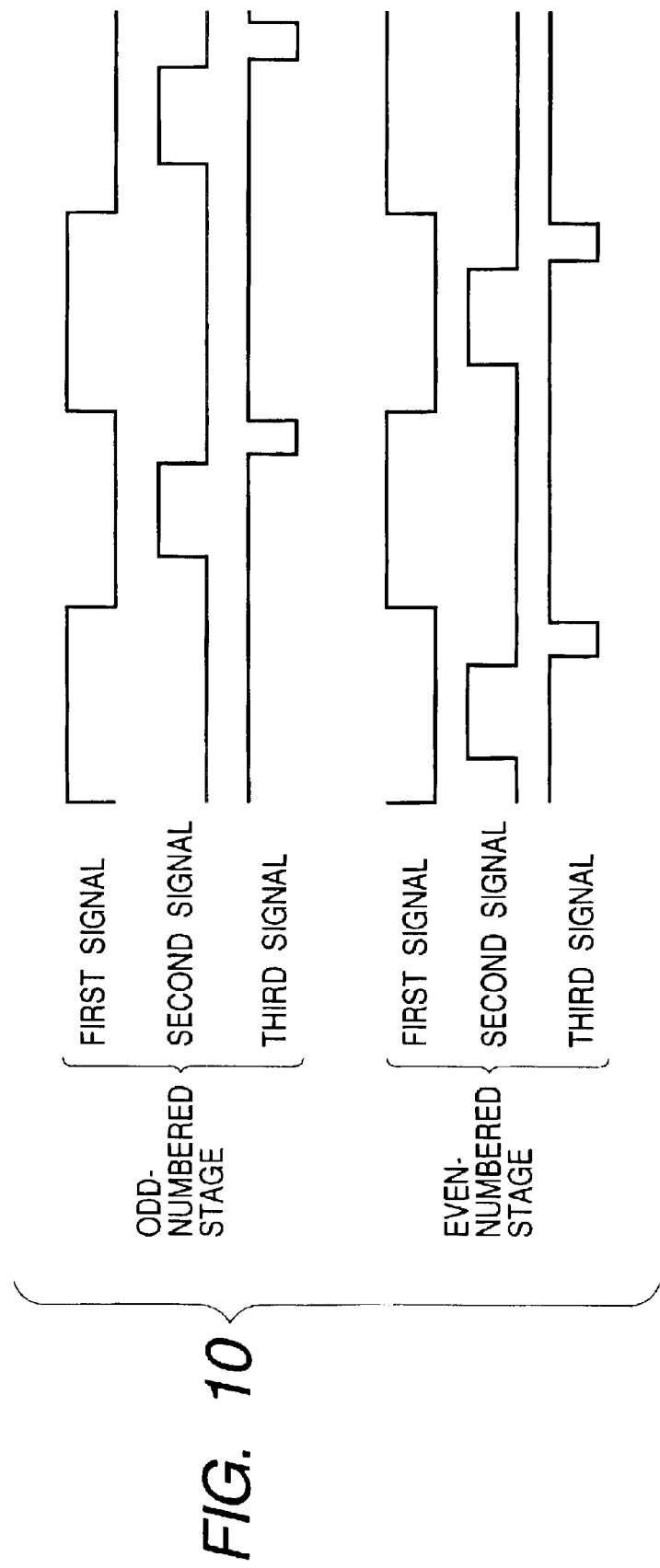
FIG. 10 shows an example of a timing chart of input signals supplied to charge pump units at different stages from a control signal generating circuit in FIG. 9.

In FIGS. 9, 11, and 12, a control signal generating circuit 3001 for a charge pump unit circuit is provided. A clock signal is supplied to an input terminal 171, and a control signal expressed by the first, second, and third signals shown in FIG. 10 is generated from the control signal generating circuit 3002 for odd-numbered stages and the control signal generating circuit 3003 for even-numbered stages. The generating circuit is realized by a combinational circuit of logic circuits.

Figure 16:
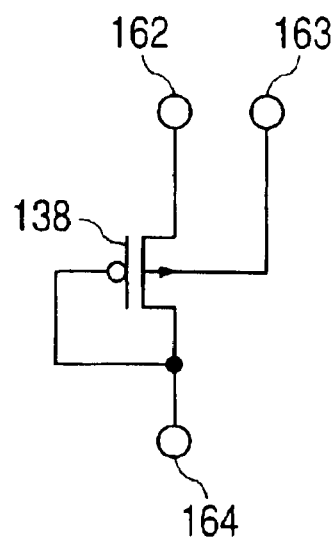
FIG. 16 shows an example of a clamp circuit in the charge pump unit at the first stage in the charge pump unit in FIG. 9.

FIG. 9 shows an example of using a clamp circuit 2011 having the function of clamping the input terminal of the charge pump unit circuit at the first stage without requiring a control signal. FIG. 16 shows a concrete circuit of the clamp circuit. In this embodiment, predetermined terminals 163 and 164 having a potential on the side of pumping charges of two terminals 172 and 174 to which the power supply voltage is applied, are allowed to clamp the input terminal 101 of the charge pump unit circuit 2001 at the first stage by a MOS diode 138 via a terminal 162.

Figure 17:
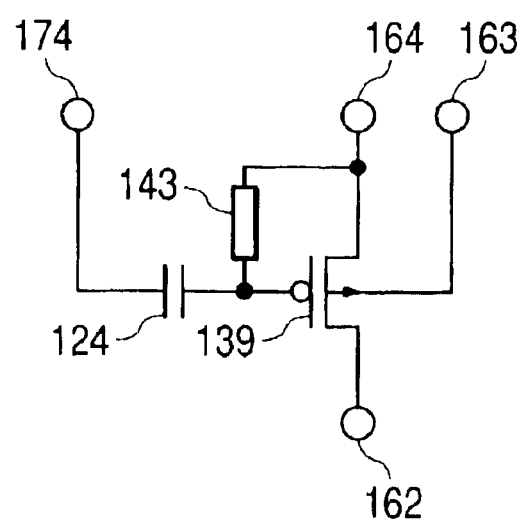
FIG. 17 shows an example of a clamp circuit of the charge pump unit at the first stage in the charge pump unit in FIG. 9.

FIG. 11 shows another example of clamping the input terminal of the charge pump unit circuit at the first stage by another method. FIG. 17 shows a concrete circuit of a clamp circuit 2012. In this embodiment, the drain of an MOS diode 139 whose gate is biased via a bias circuit 143 together with the source to a power supply terminal 174 via the terminal 164 is connected to the input terminal 101 of the charge pump unit circuit 2001 at the first stage via the terminal 162, and the clamping operation is performed under control with a first signal at an even-numbered stage supplied via a terminal 165.

Although an example of a method of clamping the input terminal of the charge pump unit circuit at the first stage is shown, as long as a circuit is for clamping, other circuit methods and also other control signals and the like may be used.

FIG. 12 shows an example of increasing the charge transfer efficiency by connecting the well bias terminal 106 of the charge pump unit circuit 2004 at the post stage to a terminal having a potential different from that of the well bias terminal 106 of a charge pump unit circuit at a front stage, for example, the charge pump unit circuit 2003.

Although the block diagrams of the charge pump circuits of FIGS. 9, 11, and 12 show examples of supplying a control signal commonly to the odd-numbered and even-numbered stages have been described, a control signal can be generated independently for each unit circuit.

Figure 18:
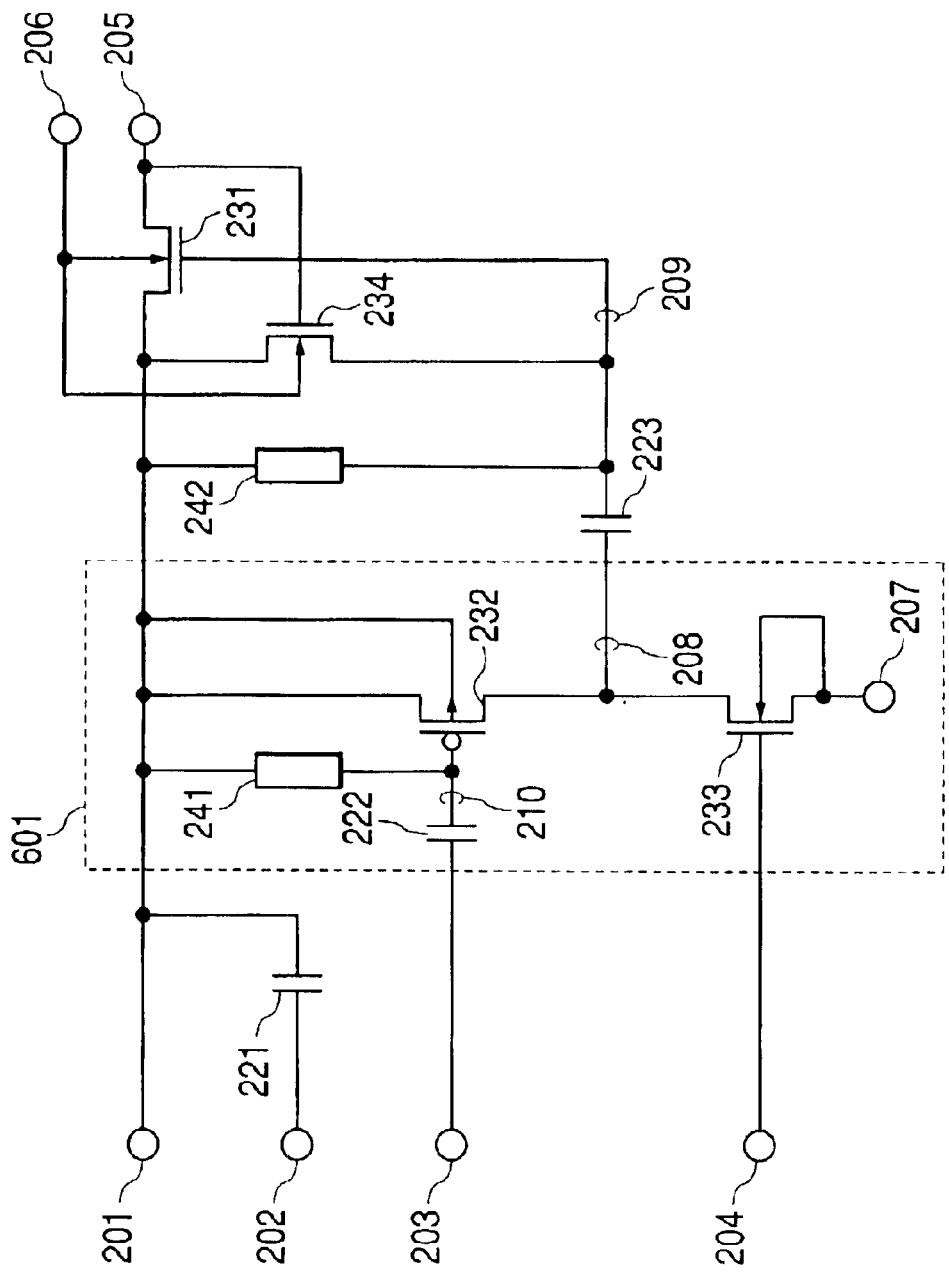
FIG. 18 is a circuit diagram of a basic unit of a charge pump provided for the high-voltage generating circuit in FIG. 4.

Although the circuit related to generation of a voltage which is negative with respect to the supplied power supply voltage has been described in the example shown in FIG. 6, in the case of a charge pumping operation by which the voltage becomes positive, the operation can be realized by the circuit shown in FIG. 18. As an example of timing waveform of control signals in this case, it is sufficient to inverse all the polarities of the control signals in the example of timings shown in FIGS. 7 and 8.

Consequently, according to the first embodiment, the charge transfer efficiency of the charge pump unit circuits 2001 to 2004 can be improved with a simple circuit configuration and with the smaller number of connection stages. Thus, the voltage increasing efficiency of the high-voltage generating circuit 15 can be improved, and the time required to increase the voltage can be shortened.

With the improved charge transfer efficiency, the total capacitance value of the first to third capacitors in the charge pump unit circuits 2001 to 2004 can be decreased, so that the layout area of the semiconductor chip can be reduced.

Second Embodiment

Figure 20:
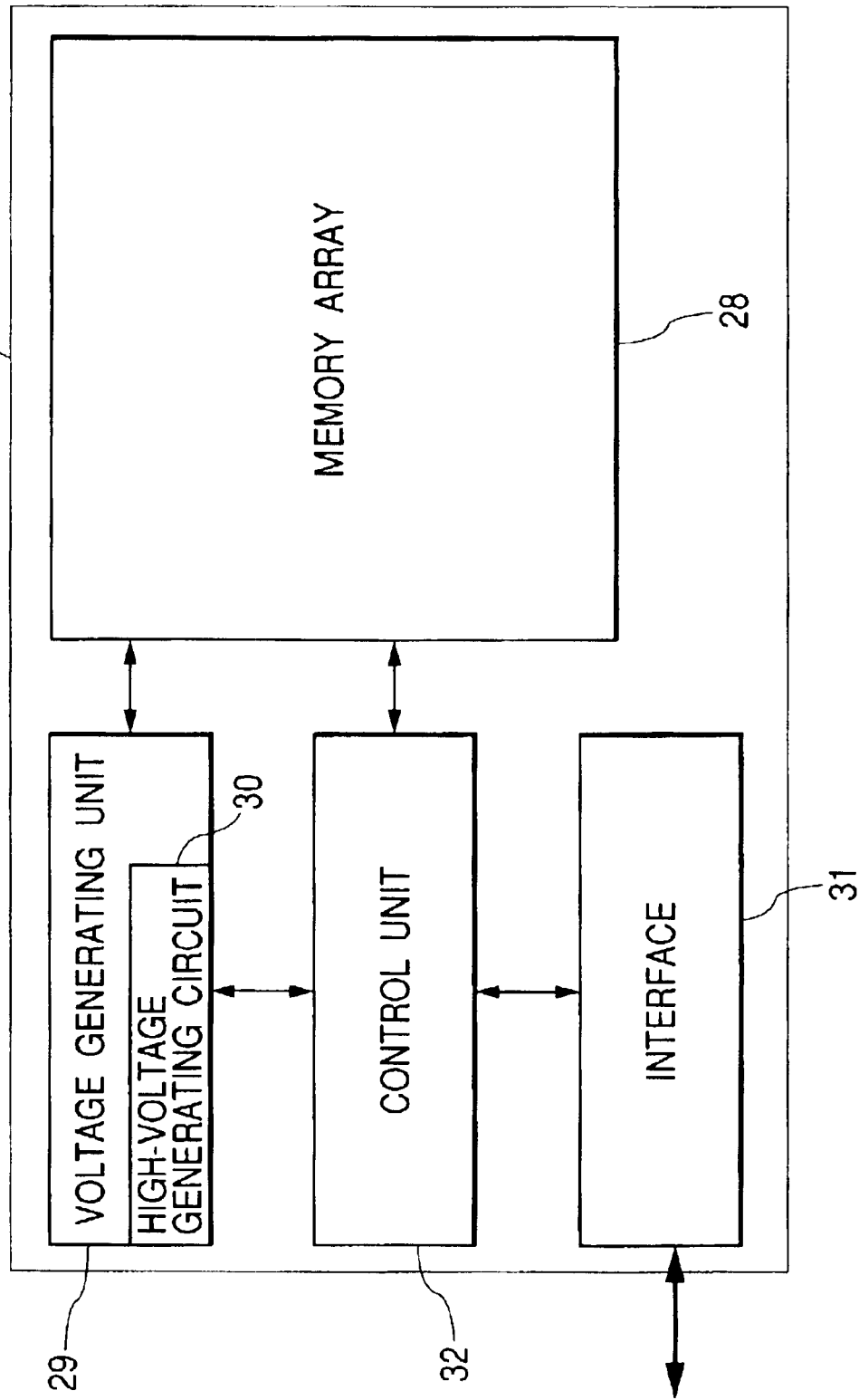
FIG. 20 is a block diagram of a nonvolatile memory according to a second embodiment of the invention.

FIG. 20 is a block diagram of a nonvolatile memory 27 according to a second embodiment of the invention. The nonvolatile memory 27 uses a high-voltage generating circuit to which the invention is applied.

In the nonvolatile memory 27, an EEPROM or a flash EEPROM (hereinbelow, called a flash memory) is used as a memory array 28. A voltage necessary for an operation of writing/erasing data to/from a memory cell in an EEPROM or flash memory is generated by using a high-voltage generating circuit 30 provided for a voltage generating unit 29.

The EEPROM or flash memory has a nitride film or floating gate for storing charges (hereinbelow, called a charge storing layer) and stores information by controlling the amount of charges stored in the charge storing layer.

An example of, particularly, a flash memory will be described below.

Flash memories are classified as an NAND type, an AND type, an NOR type, an SST type, a slit gate type, and the like in accordance with a the memory cell connection arrangement and the structure of the memory cell. An operation of writing data into a memory cell is performed by a hot electron method of applying a high positive voltage to the gate electrode of a memory cell and injecting hot electrons generated when a current flows in a channel region between the source electrode and the drain electrode into the floating gate, or an FN tunnel writing method of applying a high voltage across the channel and gate while hardly flowing a current to the channel region and injecting electrons (charges) into the floating gate by an FN tunnel phenomenon.

In a flash memory, the threshold voltage of a memory cell changes according to the amount of charges injected into the floating gate. By forming two or more threshold voltage distributions, binary data or multilevel data can be held.

The interface 31 in FIG. 20 is connected to a memory controller or a processor connected to the outside, receives a command for instructing an operation of writing, reading, or erasing, and inputs/outputs data necessary for the operation.

A control unit 32 analyzes the command and supplies a control signal to the voltage generating unit 29 so as to generate a voltage necessary for the operation. On the basis of the command and address information supplied from the outside, the control unit 32 controls an operation of accessing the memory array 28 and writing data supplied to a memory cell, reading data from a memory cell, or erasing data written in a memory cell.

In the operation of writing data into a memory cell, a high positive voltage generated by the voltage generating unit 29 is supplied to a word line connected to the gate of a memory cell, data is written by the hot electron writing method or FN tunnel writing method, a threshold is changed to a predetermined threshold according to the data, and a verifying operation is performed.

In the operation of erasing data in a memory cell, a well layer is divided on an erasing unit basis (word line unit, block unit, and the whole face of the memory array), and a high positive voltage generated by a voltage generating unit FMd is applied to a well layer having data to be erased.

By the operation, charges stored in the floating gate of a memory cell belonging to the erasure unit are pulled out by the FN tunnel phenomenon of the channel layer, and the threshold voltage of the memory cell is changed to a voltage distribution at the erasure level.

The high-voltage generating circuit (voltage generating unit) 30 for generating an increased voltage as a high positive voltage will now be described.

The high-voltage generating circuit 30 is constructed by, in a manner similar to the high-voltage generating circuit 15 (FIG. 3) in the foregoing embodiment, for example, a boost control signal generating unit (control signal generating circuit) and a plurality of charge pump unit circuits connected in series.

The circuit configuration of the charge pump unit circuit in a basic cell in the high-voltage generator used for the nonvolatile memory 27 such as a flash memory will be described by using FIG. 18.

The charge pump unit circuit shown in FIG. 18 includes an input terminal 201, an output terminal 205, input terminals 202, 203, and 204 for receiving first, second, and third signals, respectively, each having an amplitude of a power supply voltage, a power supply terminal 207, and a bias terminal 206 for the well of a predetermined MOS transistor. The second and third signals are signals changing synchronously with the first signal, correspond to signals obtained by inverting the polarities of the signals shown in FIGS. 7 and 8, and are signals changing in predetermined time in a cycle of the first signal. As a voltage generating unit, a circuit for generating a predetermined voltage is provided, which can be realized by a configuration similar to the block configuration shown in FIG. 9 and in which a plurality of charge pump unit circuits are cascaded. The first signals supplied to the odd-numbered and even-numbered stages of the plurality of unit circuits cascaded have the relation of opposite phases as shown in FIG. 10 although the positive and negative polarities are reverse, and each of the second and third signals is generated from the first signal. The charge pump unit circuit includes: a function of transmitting a signal to the input terminal 201 via a first capacitor 221 in accordance with a change in the first signal having a change in the amplitude of the power supply voltage supplied; a first MOS transistor 231 for charge transfer whose drain is connected to the input terminal 201 and whose source is connected to the output terminal 205; a circuit 601 for generating and outputting a composite signal of the second and third signals as a fourth signal having a change in voltage between the power supply voltage terminal 207 and the input terminal 201 to a fourth output terminal 208; a circuit for transmitting the fourth signal to a gate terminal 209 of the first MOS transistor 231 via a third capacitor 223; a second bias circuit 242 connected between the gate terminal 209 of the first MOS transistor 231 and the input terminal 201; and a fourth MOS transistor 234 whose gate terminal is connected to the output terminal 205. The source electrode and drain electrode of the fourth MOS transistor 234 are connected to the gate terminal 209 of the first MOS transistor 231 and the input terminal 201, respectively. The fourth signal generating circuit 601 includes a second MOS transistor 232, a third MOS transistor 233, a second capacitor 222, and a first bias circuit 241. The second signal is supplied to the gate terminal 210 of the second MOS transistor 232 via the second capacitor 222. The source and drain of the second MOS transistor 232 are connected to the input terminal 201 and the fourth signal output terminal 208, respectively. The gate of the second MOS transistor 232 is biased to the input terminal by the first bias circuit 241. The gate, source, and drain of the third MOS transistor 233 are connected to the third signal terminal 204, the power supply terminal 207, and the fourth signal output terminal 208, respectively. The well of each of the first and fourth MOS transistors 231 and 234 is connected to the well bias terminal 206 to which a predetermined well bias voltage is supplied.

A concrete circuit of each of the bias circuits 241 and 242 is realized by the resistor shown in FIG. 13, the MOS diode circuit shown in FIG. 14, or the bidirectional MOS diode circuit shown in FIG. 15. The MOS diode is not limited to an NMOS diode but may be a PMOS diode.

As described above, in the second embodiment as well, the charge transfer efficiency of the plurality of charge pump unit circuits can be improved with a simple circuit configuration with the small number of stages connected. Thus, the voltage increasing efficiency of the high-voltage generating circuit 30 can be improved, and the time required to obtain an increased voltage VFF can be shortened.

With the improved charge transfer efficiency, the sum of the capacitance values in the plurality of charge pump unit circuits can be reduced, so that the layout area of the semiconductor chip can be reduced.

Third Embodiment

Figure 3:
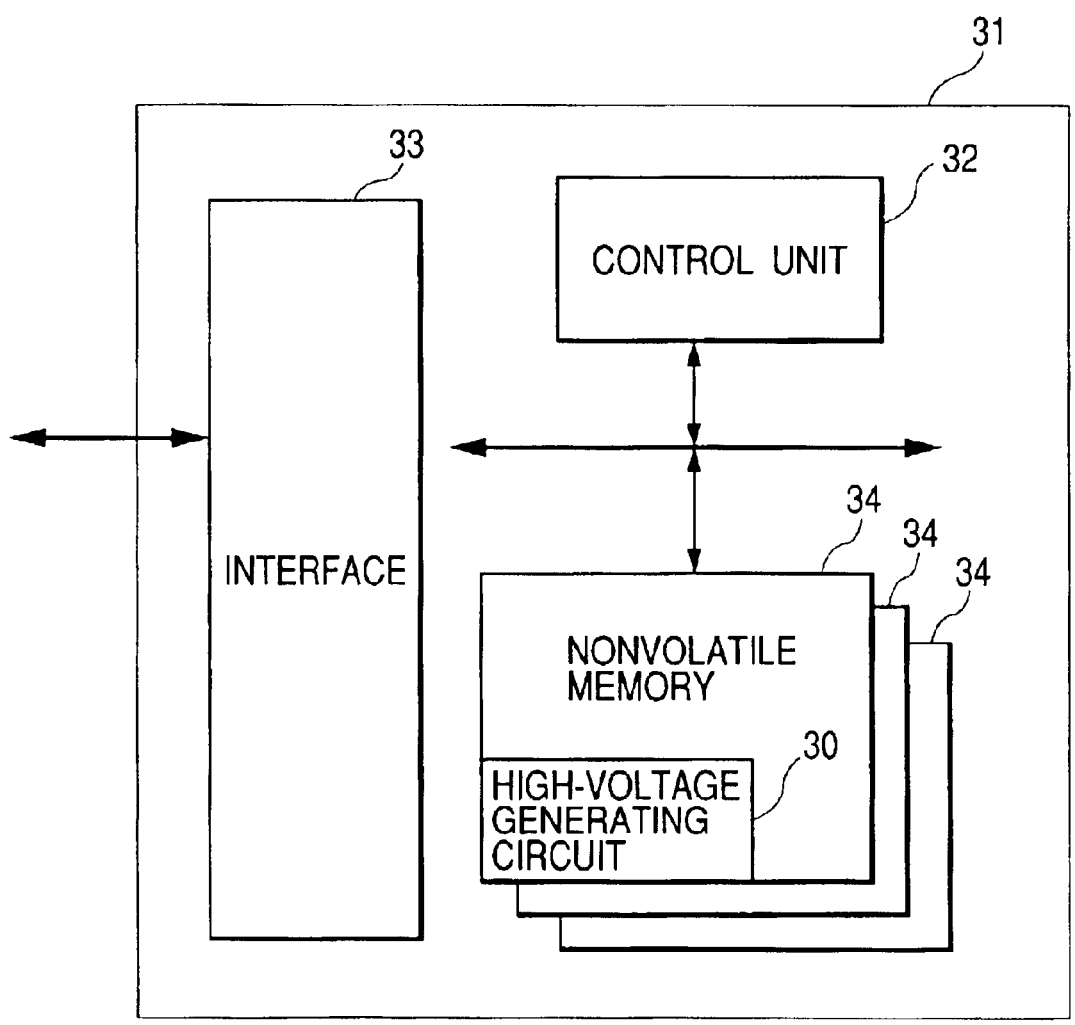
FIG. 3 is a block diagram of a nonvolatile memory device using a nonvolatile memory according to a second embodiment of the invention.
Figure 4:
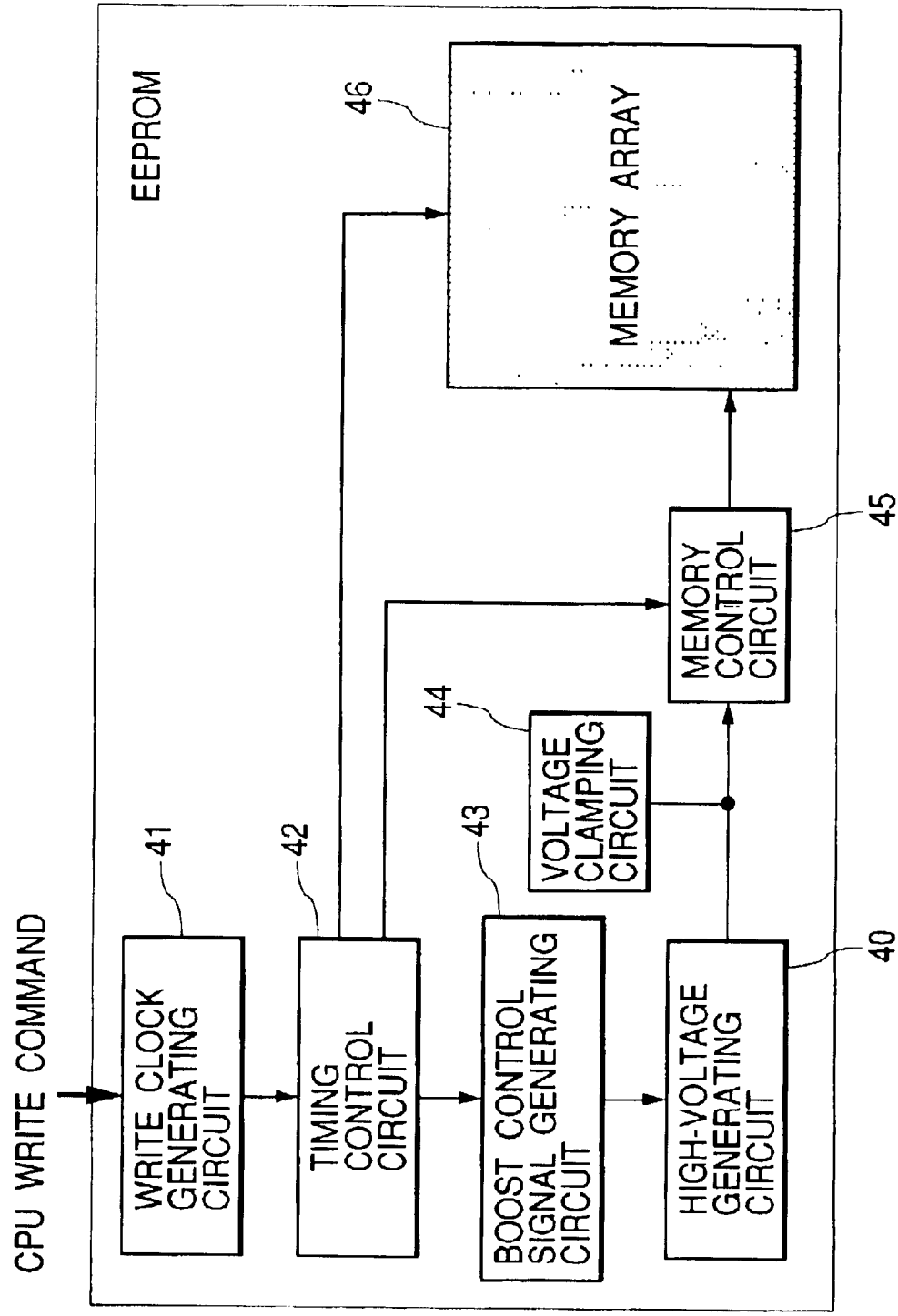
FIG. 4 is a block diagram showing a high-voltage generating circuit and its peripheral circuits of the nonvolatile memory in FIGS. 2 and 3.
Figure 5:
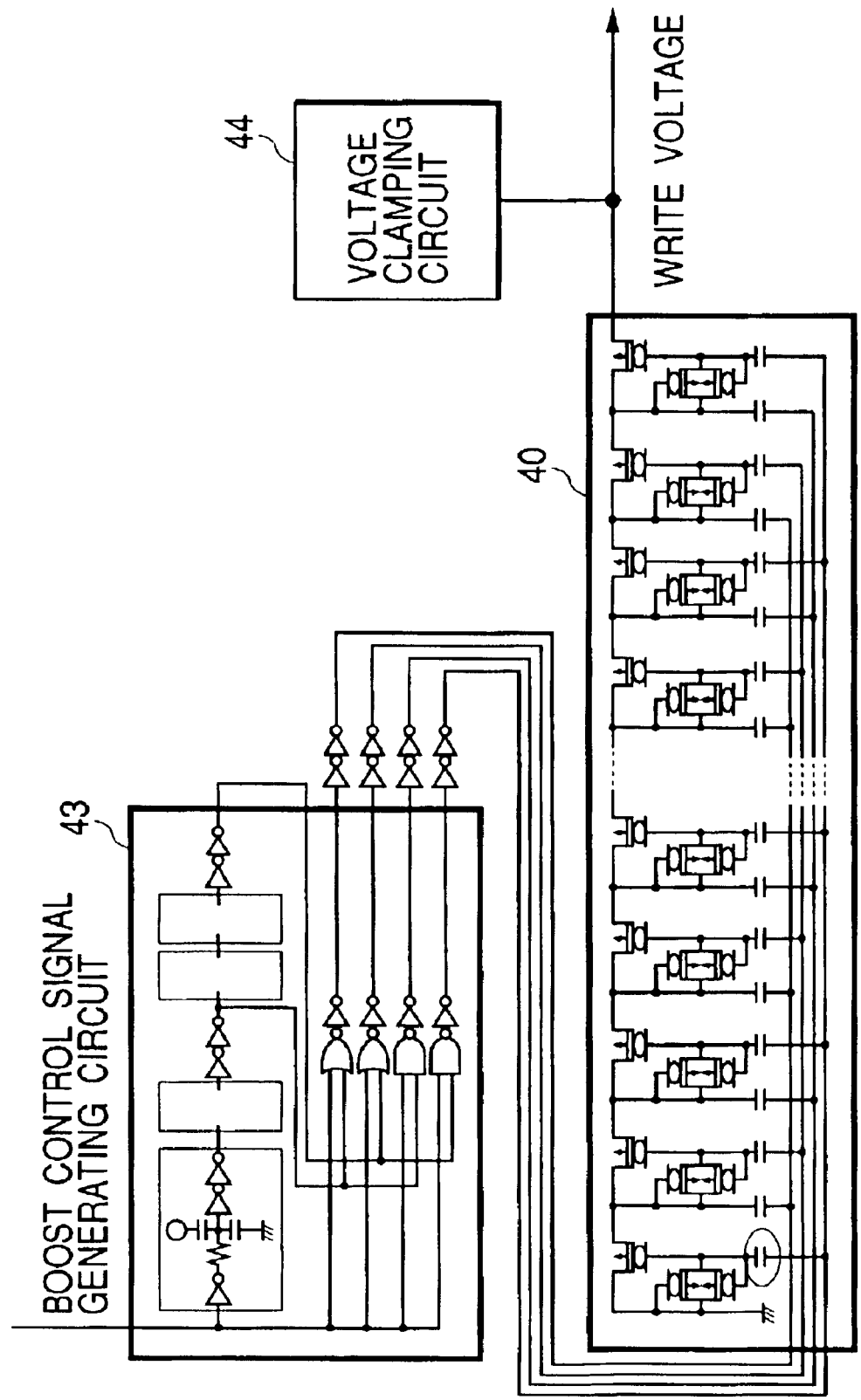
FIG. 5 is a circuit diagram of a high-voltage generating circuit in an EEPROM in FIG. 4 examined by the inventor herein.

FIG. 3 is a block diagram of a nonvolatile memory device using nonvolatile memories according to a third embodiment of the invention.

FIG. 3 is a block diagram of a nonvolatile memory device 31 using one or more nonvolatile memories 27 shown in FIG. 20, in accordance with the third embodiment.

An interface 33 can be connected to an external host or the like as necessary. The control unit 32 issues a command instructing a write/read/erase operation to a predetermined nonvolatile memory 34 in accordance with a data reading/writing operation instruction from the external host.

To/from each of the nonvolatile memories 34, data is written, read, or erased in accordance with the operation instruction from the control unit, and a high voltage necessary for the operation is generated by the high-voltage generating circuit 30.

The circuit configuration of the high-voltage generating circuit 30 used for the nonvolatile memory device 31 is similar to that of the second embodiment.

As described above, in the third embodiment as well, the charge transfer efficiency of the plurality of charge pump unit circuits can be improved with a simple circuit configuration by the small number of stages connected, so that the time required to obtain the increased high voltage VFF can be shortened, the total of the capacitance values can be reduced, and the layout area of the semiconductor chip can be reduced.

Although the invention achieved by the inventor herein has been described above concretely on the basis of the embodiments of the invention, obviously, the invention is not limited to the embodiments but may be variously modified without departing from the gist.

For example, in the foregoing first to third embodiments, the high-voltage generating circuit provided for an EEPROM, flash memory, or the like has been described. The technique of the invention can be widely applied not only to a nonvolatile memory requiring a high voltage for writing data such as EPROM, but also to general semiconductor memories requiring a high voltage higher than the power supply voltage at the time of writing and reading data, a semiconductor integrated circuit device such as a microcomputer mounting such memories, and the like.

Advantageous effects obtained by representative embodiments of the invention disclosed herein will be briefly described as followed.

(1) By realizing a simple circuit configuration, a mask necessary for manufacturing a semiconductor can be reduced, so that a high voltage can be generated at low cost.

(2) With the improved charge transfer efficiency, the number of charge pump circuits and the sum of the capacitance used can be reduced, the chip area of the semiconductor can be reduced, and the cost can be decreased.

(3) By the effects (1) and (2), the size of each of a nonvolatile memory device and a data processing system can be reduced, and higher performance can be achieved at low cost.

What is claimed is:

1. A nonvolatile memory device comprising:

a memory array having a plurality of nonvolatile memory cells;

a control unit; and a voltage generating unit, said memory array capable of storing desired information into each nonvolatile memory cell, said control unit controlling each of a writing operation of storing information into said nonvolatile memory cell, a reading operation of reading the information stored in said nonvolatile memory cell, and an erasing operation of erasing the information stored in said nonvolatile memory cell, said voltage generating unit generating a predetermined voltage to be applied to a memory cell in each of said operations in accordance with a control from said control unit, and having a control signal generating circuit and a plurality of charge pump unit circuits, the control signal generating circuit generating a control signal to be supplied to said plurality of charge pump unit circuits, each said charge pump unit circuit comprising:

a stage input terminal;

a stage output terminal;

first, second, and third signal input terminals for receiving first, second, and third signals, respectively, each signal having an amplitude of a power supply voltage;

a power supply terminal, and a bias terminal for a well of a predetermined MOS transistor, said second and third signals being signals changing synchronously with said first signal and changing in predetermined time in a cycle of said first signal, said voltage generating unit being a circuit in which a plurality of said charge pump unit circuits are cascaded, for generating said predetermined voltage, said first signal supplied to an odd-numbered stage and said first signal supplied to an even-numbered stage of said plurality of cascaded unit circuits having opposite phases, each of said second and third signals being generated from the corresponding first signal, each said charge pump unit circuit additionally having:

a function of transmitting a signal to said stage input terminal thereof via a respective first capacitor in accordance with a change in the corresponding first signal having a change in the amplitude of the power supply voltage, supplied;

a first MOS transistor for charge transfer whose drain is connected to said stage input terminal and whose source is connected to said stage output terminal;

a fourth signal generating circuit generating and outputting a composite signal of said second and third signals as a fourth signal having a change in voltage between the power supply terminal and said stage input terminal to a fourth signal output terminal;

a circuit transmitting said fourth signal to the gate terminal of said first MOS transistor via a third capacitor;

a second bias circuit connected between the gate terminal of said first MOS transistor and said stage input terminal; and a fourth MOS transistor whose gate terminal is connected to said stage output terminal, a source electrode and a drain electrode of said fourth MOS transistor being connected to the gate terminal of said first MOS transistor and said stage input terminal, respectively, said fourth signal generating circuit including a second MOS transistor, a third MOS transistor, a second capacitor, and a first bias circuit, said second signal being supplied to the gate terminal of said second MOS transistor via said second capacitor, the source and drain of said second MOS transistor being connected to said stage input terminal and said fourth signal output terminal, respectively, the gate of said second MOS transistor being biased to said stage input terminal by said first bias circuit, the gate, source, and drain of said third MOS transistor being connected to said third signal input terminal, said power supply terminal, and said fourth signal output terminal, respectively, and the well of each of said first and fourth MOS transistors being connected to said well bias terminal, to which a predetermined well bias voltage is supplied.

2. A nonvolatile memory device comprising:

a memory array having a plurality of nonvolatile memory cells;

a control unit; and a voltage generating unit, said memory array capable of storing desired information into each nonvolatile memory cell, having a plurality of word lines and a plurality of data lines, a gate electrode of each nonvolatile memory cell being connected to a corresponding word line, and the nonvolatile memory cells being connected to corresponding data lines, thereby forming nonvolatile memory cells in an array, and having one or more groups of nonvolatile memory cells sharing a well region, said control unit storing information into said nonvolatile memory cell and controlling supply of a voltage generated by said voltage generating unit to a corresponding word line and/or a corresponding well region to erase the information stored in said nonvolatile memory cell, said voltage generating unit generating a predetermined voltage to be applied to a memory cell in each of said operations in accordance with a control from said control unit, having a control signal generating circuit and a plurality of charge pump unit circuits, the control signal generating circuit generating a control signal to be supplied to said plurality of charge pump unit circuits, each said charge pump unit circuit comprising:

a stage input terminal;

a stage output terminal;

first, second, and third signal input terminals for receiving first, second, and third signals, respectively, each signal having an amplitude of a power supply voltage;

a power supply terminal; and a bias terminal for a well of a predetermined MOS transistor, said second and third signals being signals changing synchronously with said first signal and changing in predetermined time in a cycle of said first signal, said voltage generating unit being a circuit in which a plurality of said charge pump unit circuits are cascaded, for generating a said predetermined voltage, said first signal supplied to an odd-numbered stage and said first signal supplied to an even-numbered stage of said plurality of cascaded charge pump unit circuits having opposite phases, each of said second and third signals being generated from the corresponding first signal, each said charge pump unit circuit additionally having:

a function of transmitting a signal to said stage input terminal thereof via a respective first capacitor in accordance with a change in the corresponding first signal having a change in the amplitude of the power supply voltage supplied;

a first MOS transistor for charge transfer whose drain is connected to said stage input terminal and whose source is connected to said stage output terminal;

a fourth signal generating circuit generating and outputting a composite signal of said second and third signals as a fourth signal having a change in voltage between the power supply terminal and said stage input terminal to a fourth signal output terminal;

a circuit transmitting said fourth signal to the gate terminal of said first MOS transistor via a third capacitor;

a second bias circuit connected between the gate terminal of said first MOS transistor and said stage input terminal; and a fourth MOS transistor whose gate terminal is connected to said stage output terminal, a source electrode and a drain electrode of said fourth MOS transistor being connected to the gate terminal of said first MOS transistor and said stage input terminal, respectively, said fourth signal generating circuit including a second MOS transistor, a third MOS transistor, a second capacitor, and a first bias circuit, said second signal being supplied to the gate terminal of said second MOS transistor via said second capacitor, the source and drain of said second MOS transistor being connected to said stage input terminal and said fourth signal output terminal, respectively, the gate of said second MOS transistor being biased to said stage input terminal by said first bias circuit, the gate, source, and drain of said third MOS transistor being connected to said third signal input terminal, said power supply terminal, and said fourth signal output terminal, respectively, and the well of each of said first and fourth MOS transistors is connected to said well bias terminal, to which a predetermined well bias voltage is supplied.

3. The nonvolatile memory device according to claim 2, wherein said voltage generating unit has a clamp circuit for clamping said stage input terminal of the charge pump unit circuit at the first stage in said plurality of charge pump unit circuits by using a MOS diode.

4. The nonvolatile memory device according to claim 3, wherein said voltage generating unit has a circuit for clamping said stage input terminal of the charge pump unit circuit at the first stage in said plurality of charge pump unit circuits by making a MOS transistor perform switching operation in a predetermined period synchronized with said first signal.

5. The nonvolatile memory device according to claim 4, wherein a bias is applied to the well of said first MOS transistor for charge transfer of a predetermined charge pump unit circuit at a post stage in charge pump unit circuits of a plurality of stages, the bias being different from a bias applied to the well of said first MOS transistor for charge transfer of a predetermined charge pump unit circuit at an ante stage, thereby decreasing a voltage control threshold of said first MOS transistor for charge transfer.

6. A data processing system comprising a nonvolatile memory unit and a central processing unit, a first operation voltage being supplied from the outside, said central processing unit executing a predetermined process to instruct said nonvolatile memory unit to perform an operation, said nonvolatile memory unit having a plurality of nonvolatile memory cells for storing information and a voltage generating unit, for accessing said plurality of nonvolatile memory cells in accordance with an operation instruction from said central processing unit to store or read information to/from said plurality of memory cells, and instructing said voltage generating unit to generate a predetermined voltage in accordance with an information storing operation instruction from said central processing unit, said voltage generating unit generating a predetermined voltage to be applied to a memory cell in each of said operations in accordance with a control from said control unit, and having a control signal generating circuit and a plurality of charge pump unit circuits, the control signal generating circuit generating a control signal to be supplied to said plurality of charge pump unit circuits, each said charge pump unit circuit comprising:

a stage input terminal;

a stage output terminal;

first, second, and third signal input terminals for receiving first, second, and third signals, respectively, each having an amplitude of a power supply voltage;

a power supply terminal; and a bias terminal of a well of a predetermined MOS transistor, said second and third signals being signals changing synchronously with said first signal and changing in predetermined time in a cycle of said first signal, said voltage generating unit being a circuit in which a plurality of said charge pump unit circuits are cascaded, for generating said predetermined voltage, said first signal to be supplied to an odd-numbered stage and said first signal to be supplied to an even-numbered stage of said plurality of cascaded charge pump unit circuits having opposite phases, and each of said second and third signals being generated from the corresponding first signal, each said charge pump unit circuit additionally having:

a function of transmitting a signal to said stage input terminal thereof via a first capacitor in accordance with a change in the corresponding first signal having a change in the amplitude if the power supply voltage supplied;

a first MOS transistor for charge transfer whose drain is connected to said stage input terminal and whose source is connected to said stage output terminal;

a fourth signal generating circuit generating and outputting a composite signal of said second and third signals as a fourth signal having a change in voltage between the power supply terminal and said stage input terminal to a fourth signal output terminal;

a circuit transmitting said fourth signal to the gate terminal of said first MOS transistor via a third capacitor;

a second bias circuit connected between the gate terminal of said first MOS transistor and said stage input terminal; and a fourth MOS transistor whose gate terminal is connected to said stage output terminal, a source electrode and a drain electrode of said fourth MOS transistor being connected to the gate terminal of said first MOS transistor and said stage input terminal, respectively, said fourth signal generating circuit including a second MOS transistor, a third MOS transistor, a second capacitor, and a first bits circuit, said second signal being supplied to the gate terminal of said second MOS transistor via said second capacitor, the source and drain of said second MOS transistor being connected to said stage input terminal and said fourth signal output terminal, respectively, the gate of said second MOS transistor being biased to said stage input terminal by said first bias circuit, the gate, source, and drain of said third MOS transistor being connected to said third signal input terminal, said power supply terminal, and said fourth signal output terminal, respectively, and the well of each of said first and fourth MOS transistors being connected to said well bias terminal, to which a predetermined well bias voltage is supplied.

7. The data processing system according to claim 6, wherein said central processing unit gives an operation instruction of instructing erasure of information stored in said nonvolatile memory unit, wherein said nonvolatile memory unit instructs said voltage generating unit to generate a second predetermined voltage in accordance with the information erasing operation instruction from said central processing unit, and wherein said charge pump unit circuit at the final stage outputs said second predetermined voltage.

8. A data processing system comprising a semiconductor processing device to which an operation instruction signal and an operation voltage are supplied from the outside and which performs a predetermined process in accordance with said operation instruction signal, said semiconductor processing device comprising a nonvolatile memory unit, a volatile memory unit, and a central processing unit, to which said operation instruction signal and an operation voltage are supplied, said central processing unit executing a process by using said nonvolatile memory unit in said predetermined process and instructing said nonvolatile memory unit to store predetermined information, said nonvolatile memory unit having a plurality of nonvolatile memory cells for storing information and a voltage generating unit comprised of a plurality of charge pump unit circuits, said voltage generating unit being a circuit to which said operation voltage is supplied and which generates a first predetermined voltage to be applied to said nonvolatile memory cell for storing information into said nonvolatile memory cell, each said charge pump unit circuit comprising:

a stage input terminal;

a stage output terminal;

first, second, and third signal input terminals for receiving first, second, and third signals, respectively, each signal having an amplitude of a power supply voltage;

a power supply terminal; and a bias terminal for a well of a predetermined MOS transistor, said second and third signals being signals changing synchronously with said first signal and changing in predetermined time in a cycle of said first signal, said voltage generating unit being a circuit in which a plurality of said charge pump unit circuits are cascaded, for generating said first predetermined voltage, said first signal to be supplied to an odd-numbered stage and said first signal to be supplied to an even-numbered stage of said plurality of cascaded charge pump unit circuits having opposite phases, each of said second and third signals being generated from the corresponding first signal, each said charge pump unit circuit additionally having:

a function of transmitting a signal to said stage input terminal thereof via a first capacitor in accordance with a change in said first signal having a change in the amplitude of the power supply voltage supplied;

a first MOS transistor for charge transfer whose drain is connected to said stage input terminal and whose source is connected to said stage output terminal;

a fourth signal generating circuit generating and outputting a composite signal of said second and third signals as a fourth signal having a change in voltage between the power supply terminal and said stage input terminal to a fourth output terminal;

a circuit transmitting said fourth signal to the gate terminal of said first MOS transistor via a third capacitor;

a second bias circuit connected between the gate terminal of said first MOS transistor and said stage input terminal; and a fourth MOS transistor whose gate terminal is connected to said stage output terminal, a source electrode and a drain electrode of said fourth MOS transistor being connected to the gate terminal of said first MOS transistor and said stage input terminal, respectively, said fourth signal generating circuit including a second MOS transistor, a third MOS transistor, a second capacitor, and a first bias circuit, said second signal being supplied to the gate terminal of said second MOS transistor via said second capacitor, the source and drain of said second MOS transistor being connected to said stage input terminal and said fourth signal output terminal, respectively, the gate of said second MOS transistor being biased to said stage input terminal by said first bias circuit, the gate, source, and drain of said third MOS transistor being connected to aid third signal input terminal, said power supply terminal, and said fourth signal output terminal, respectively, the well of each of said first and fourth MOS transistors is connected to said well bias terminal, to which a predetermined well bias voltage is supplied, and said nonvolatile memory unit selecting a nonvolatile memory for storing said predetermined information and supplying said first predetermined voltage to said selected nonvolatile memory to store said predetermined information.

9. The data processing system according to claim 8, wherein said central processing unit gives an instruction of erasing information stored in said selected nonvolatile memory before giving an instruction of storing said desired information into said nonvolatile memory unit, said voltage generating unit generates a second predetermined voltage, and said nonvolatile memory unit supplies said second predetermined voltage to said selected nonvolatile memory, thereby erasing the information stored in said nonvolatile memory.

10. The data processing system according to claim 9, wherein said nonvolatile memory unit includes:

a first storing unit for storing a program in which said predetermined process to be executed by said central processing unit is described; and a second storing unit for storing said predetermined information.

11. The data processing system according to claim 10, wherein it is inhibited to erase or rewrite data from/to said first storing unit, and data can be erased or rewritten from/to said second storing unit.

12. The data processing system according to claim 11, wherein said voltage generating unit has a circuit clamping said stage input terminal of a charge pump unit circuit at a first stage in said plurality of charge pump unit circuits in a predetermined period synchronized with said first signal by making a MOS transistor perform switching operation.

13. The data processing system according to claim 12, wherein a terminal, to which said fourth signal is to be input, of said third capacitor of a predetermined charge pump unit circuit at a post stage in said charge pump unit circuits of a plurality of stages is connected to an output terminal of a fourth signal generating circuit of a charge pump unit circuit provided at an ante stage of said predetermined charge pump unit circuit at a post stage only by even-numbered stages.

* * * * *